US009113551B2

(12) United States Patent
McClatchie et al.

(10) Patent No.: US 9,113,551 B2
(45) Date of Patent: Aug. 18, 2015

(54) RIGID FLEX CIRCUIT BOARD

(71) Applicant: Google Inc., Mountain View, CA (US)

(72) Inventors: Iain Richard Tyrone McClatchie, Los Altos, CA (US); Ian Muldoon, Redwood City, CA (US)

(73) Assignee: Google Inc., Mountain View, CA (US)

( * ) Notice: Subject to any disclaimer, the term of this patent is extended or adjusted under 35 U.S.C. 154(b) by 390 days.

(21) Appl. No.: 13/661,585

(22) Filed: Oct. 26, 2012

(65) Prior Publication Data

US 2015/0163937 A1 Jun. 11, 2015

Related U.S. Application Data

(60) Provisional application No. 61/672,721, filed on Jul. 17, 2012.

(51) Int. Cl.
*H05K 1/03* (2006.01)
*H05K 7/02* (2006.01)
*H05K 1/02* (2006.01)
*H05K 1/14* (2006.01)

(52) U.S. Cl.
CPC .................. *H05K 7/02* (2013.01); *H05K 1/028* (2013.01); *H05K 1/14* (2013.01); *H05K 1/147* (2013.01)

(58) Field of Classification Search
CPC ............ H05K 1/03; H05K 1/14; H05K 1/148
USPC ............. 250/216, 206, 559.01; 361/748, 749, 361/751; 174/254, 255, 261; 29/825, 846, 29/852
See application file for complete search history.

(56) References Cited

U.S. PATENT DOCUMENTS 6,384,339 B1 * 5/2002 Neuman ........................ 174/254
8,241,972 B2 * 8/2012 Wang et al. ................... 438/158

* cited by examiner

*Primary Examiner* — Kevin Pyo
(74) *Attorney, Agent, or Firm* — Lerner, David, Littenberg, Krumholz & Mentlik, LLP

(57) ABSTRACT

Systems, methods and articles of manufacture for rigid flex circuit boards are described herein. Embodiments of the present disclosure relate to equipping a rigid flex circuit board with a first rigid substrate, a second rigid substrate that includes an asymmetric region where the first rigid substrate is not extended over the asymmetric region of the second rigid substrate. The rigid flex circuit board also includes a flexible substrate between the first rigid substrate and the second rigid substrate. A second portion of the flexible substrate protrudes from the non-overlap region where the second portion of the flexible substrate is not adhered to the second rigid substrate in the non-overlap region. The second portion of the flexible substrate is configured to be accessible from the asymmetric region of the rigid flex circuit board.

27 Claims, 9 Drawing Sheets

RIGID FLEX CIRCUIT BOARD

CROSS-REFERENCE TO RELATED APPLICATIONS

This application is a U.S. nonprovisional patent application which claims the benefit of U.S. Provisional Patent Application No. 61/672,721 filed on Jul. 17, 2012, which is incorporated herein by reference in its entirety.

BACKGROUND

A rigid flex circuit board includes a combination of rigid circuit portions and flexible circuits that form a single, electrically interconnected structure. The rigid circuit board incorporates two printed circuit boards (PCBs) that act as external layers, making the rigid circuit board a rigid structure with an inner flexible layer. In the flexible circuits, the two external PCBs included in the rigid circuit boards are cut away leaving the inner flexible layer as a flexible structure.

The flexible circuit typically protrudes from the edge of the rigid circuit board, maintaining the electrical interconnection between the rigid circuit board and flexible circuit. Such designs are space-inefficient as the flexible circuit prevents dense abutment of a second rigid flex circuit board. Other designs attempt to minimize the space occupied by the circuit board by connecting the flexible circuit to the top surface of the rigid circuit board. The flexible circuit maintains the electrical interconnection with the rigid circuit board via a connector placed on the top surface of the rigid circuit board. For small rigid circuit boards, finding an appropriately sized connector is difficult and/or increases the cost of the circuit board.

BRIEF SUMMARY

Embodiments of the present disclosure relate to rigid flex circuit boards. In a first embodiment, a rigid flex circuit board includes a first rigid substrate. The rigid flex circuit board also includes a second rigid substrate that includes an asymmetric region where the first rigid substrate is not extended over the asymmetric region of the second rigid substrate. The rigid flex circuit board also includes a first portion of a flexible substrate that is between the first rigid substrate and the second rigid substrate.

In a second embodiment, a rigid flex circuit board configuration includes a first rigid flex circuit board. The first rigid flex circuit board includes at least a first rigid portion and a first flex portion. The rigid flex circuit board configuration also includes a second rigid flex circuit board that includes at least a first rigid portion and a first flex portion. The first flex portion of the second rigid flex circuit board may be routed through a notch cut in the first rigid flex circuit board. The notch cut may be created based on the absence of the accessible surface of the first rigid flex circuit board.

Further embodiments, features, and advantages, as well as the structure and operation of the various embodiments, are described in detail below with reference to the accompanying drawings.

BRIEF DESCRIPTION OF THE DRAWINGS/FIGURES

Embodiments are described with reference to the accompanying drawings. In the drawings, like reference numbers may indicate identical or functionally similar elements.

DETAILED DESCRIPTION

In the Detailed Description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic may be described in connection with an embodiment, it may be within the knowledge of one skilled in the art to effect such feature, structure, or characteristic in connection with other embodiments whether or not explicitly described.

Rigid Flex Circuit Board with a Connectorless Protrusion from a Rigid Base

In a high resolution camera that may utilize an array of sensors it is important for image sensors to be packed closely together. These image sensors typically sit on rigid circuit boards, which are connected to other components via a flex component. Because space is often limited, this system allows sensors to be packed more closely together while allowing them to be mechanically independent. Using a rigid flex board according to an embodiment, where the flex portion protrudes from a surface of the rigid portion rather than the edge of the rigid portion, saves valuable space at the edge of the board. Further, an integrated flex portion rather than an attached flex portion improves the integrity of the rigid flex board.

Figure 1:
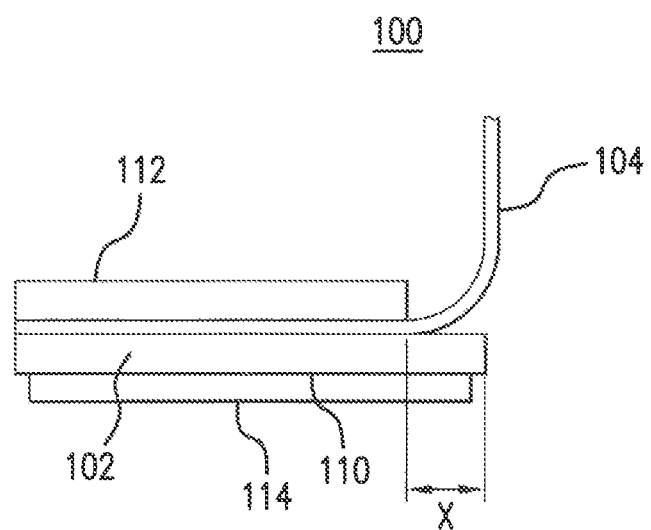
FIG. 1 depicts a cross-sectional view of an example rigid flex circuit board in which embodiments of the present disclosure, or portions thereof, may be implemented.

FIG. 1 depicts a cross-section of an example rigid flex circuit board 100 with a flex that protrudes vertically from a rigid base. The surface area of accessible surface 112 may be less than the surface area of sensor surface 110. The difference in the surface area between accessible surface 112 and sensor surface 110 creates a non-overlap region defined by lateral distance X. First flex portion 104 protrudes from the non-overlap region rather than from the edge of rigid flex circuit board 100. The protrusion of first flex portion 104 from the non-overlap region conserves space between rigid flex circuit board 100 and a second rigid flex circuit board packed next to rigid flex circuit board 100. A flex portion that protrudes from the edge of a rigid flex circuit board occupies valuable space between the rigid flex circuit board and the second rigid flex circuit board packed next to the rigid flex circuit board. As a result, rigid flex circuit board 100 may be implemented for space conservation.

Rigid flex circuit board 100 includes first rigid portion 102, first flex portion 104, and focal plane image sensor 114. First rigid portion 102 includes accessible surface 112 and sensor surface 110. As would be appreciated by one having skill in the relevant art(s) given the description herein, rigid flex circuit board 100 may include any quantity of rigid portions and flex portions without departing from the spirit and scope of the present invention.

In an embodiment, first rigid portion 102 may act as a base for rigid flex circuit board 100. First rigid portion 102 couples to focal plane image sensor 114. For example, the focal plane image sensor 114 may directly attach to first rigid portion 102 such that focal plane image sensor 114 is located directly below first rigid portion 102. First rigid portion 102 may receive image data gathered by focal plane image sensor 114, and route the image data to first flex portion 104.

First flex portion 104 extends from first rigid portion 102. First flex portion 104 extends from the edge of the accessible surface of first rigid portion 102 rather than the edge of the sensor surface, where the edge of the accessible surface is not directly in line with the edge of the sensor surface but is instead located a lateral distance from the edge of the sensor surface of first rigid portion 102. The extension of first flex portion 104 from first rigid portion 102 maintains an electrical interconnection between first rigid portion 102 and first flex portion 104. The electrical interconnection between first rigid portion 102 and first flex portion 104 may be maintained without the use of a connector. As would be appreciated by one having skill in the relevant art(s) given the description herein, the electrical interconnection may also include electrical interconnections provided by connectors, electrically conductive epoxy, ball grid arrays, solder balls, and/or any other suitable functionality without departing from the spirit and scope of the present invention.

First rigid portion 102 and first flex portion 104 maintains the electrical interconnection provided by the single multilayer circuit board that produced both first rigid portion 102 and first flex portion 104 such that rigid flex circuit board 100 is a single board. First rigid portion 102 and first flex portion 104 may each be produced from a single multilayer circuit board. The multilayer circuit board may include two rigid printed circuit boards (PCBs) that act as external layers and an inner flexible layer between each of the external rigid layers. As a result, the external layers and inner flexible layer of the rigid PCBs are bonded together. Each layer of the multilayer circuit board may be electrically interconnected using vias. As would be appreciated by one having skill in the relevant art(s) given the description herein, multilayer circuit boards may include additional layers to the two external rigid layers and the inner flexible layer without departing from the spirit and scope of the present invention.

First rigid portion 102 is produced from the multilayer circuit board. Rigid portion 102 may include accessible surface 112 and sensor surface 110. Accessible surface 112 may include one external rigid layer of the multilayer circuit board, and sensor surface 110 may include another external rigid layer of the multilayer circuit board. Accessible surface 112 and sensor surface 110 make first rigid portion 102 a rigid structure. First rigid portion 102 may include inner layers from the multilayer circuit board including the flexible layer.

First flex portion 104 is produced from the same multilayer circuit board as first rigid portion 102. First flex portion 104 may be produced by removing the external rigid layers from the multilayer circuit board, leaving the inner flexible layer as a flexible structure. First flex portion 104 and first rigid portion 102 maintain the same electrical interconnection that the original multilayer board included. In doing so, first flex portion 104 serves as an extension of first rigid portion 102 in the cross-section.

Rather than first flex portion 104 protruding from an edge of first rigid portion 102, first flex portion 104 protrudes from the surface of first rigid portion 102. In an embodiment, accessible surface 112 is a different shape than sensor surface 110, such that first flex portion 104 protrudes from the surface of first rigid portion 102 rather than the edge of first rigid portion 102. The difference in shape between accessible surface 112 and sensor surface 110 may create an asymmetrical region. The asymmetrical region may be defined as the additional region included in sensor surface 110 as compared to accessible surface 112 such that the surface area of accessible surface 112 differs from the surface area of sensor surface 110 by the surface area included in the asymmetrical region. The difference in shape between accessible surface 112 and sensor surface 110 may also create a non-overlap region. The non-overlap region may be defined as the region included in sensor surface 110 that is not overlapped by accessible surface 112.

For example, accessible surface 112 may be cut shorter than sensor surface 110 at the boundary of first rigid portion 102 and first flex portion 104. The difference in surface area between accessible surface 112 and sensor surface 110 based on accessible surface 112 being cut shorter than sensor surface 110 is the asymmetrical region and/or non-overlap region. The lateral difference between the edges of accessible surface 112 and sensor surface 110 determines the position on the surface of first rigid portion 102 from which first flex portion 104 protrudes.

For example, the lateral distance between accessible surface 112 and sensor surface 110 may be lateral distance X. When lateral distance X is equivalent to zero, accessible surface 112 and sensor surface 110 are cut in the same size and shape at the boundary of first rigid portion 102 and first flex portion 104. When lateral distance X is equivalent to zero, as in a conventional rigid flex circuit board, first flex portion 104 protrudes from the edge of first rigid portion 102 rather than from the accessible surface of first rigid portion 102.

When lateral distance X is equal to a value greater than zero, accessible surface 112 is cut shorter than sensor surface 110 at the boundary of first rigid portion 102 and first flex portion 104, such that first flex portion 104 protrudes from the accessible surface of first rigid portion 102. The location on the accessible surface from which first flex portion 104 protrudes is based on the boundary of accessible surface 112. The greater the lateral distance X between accessible surface 112 and sensor surface 110, the farther along the accessible surface that first flex portion 104 protrudes from the accessible surface of first rigid portion 102. The lesser the lateral distance X between accessible surface 112 and sensor surface 110, the closer to the edge of first rigid portion 102 that first flex portion 104 protrudes from.

In an embodiment, first flex portion 104 may protrude vertically in a perpendicular manner from the accessible surface of first rigid portion 102. The difference in lateral distance X between accessible surface 112 and sensor surface 110 at the boundary of first rigid portion 102 and first flex portion 104 enables first flex portion 104 to bend so that first flex portion 104 bends in a perpendicular manner from the accessible surface of first rigid portion 102. For example, first flex portion 104 may bend at a ninety degree angle at the boundary of accessible surface 112 and sensor surface 110 so that first flex portion 104 protrudes in a perpendicular manner from the accessible surface of first rigid portion 102. First flex portion 104 may receive image data gathered by focal plane image sensor 114 and routed by first rigid portion 102 to first flex portion 104.

In an embodiment, first flex portion couples to a second rigid portion (not shown). The second rigid portion may be produced from the same multilayer circuit board as first rigid portion 102. First flex portion 104 may protrude from an edge of the second rigid portion. As would be appreciated by one having skill in the relevant art(s) given the description herein, first flex portion 104 may instead protrude from a surface of the second rigid portion in a similar fashion as first flex portion 104 protruding from the surface of first rigid portion 102 discussed above without departing from the spirit and scope of the present invention. The second rigid portion may receive image data gathered by focal plane image sensor 114 and routed by first rigid portion 102 to first flex portion 104 and then routed from first flex portion 104 to the second rigid portion.

In an embodiment, a second flex portion (not shown) may be produced from the same multilayer circuit board as the second rigid portion, first flex portion 104, and first rigid portion 102. The formation of the second flex portion may be similar to that of first flex portion 104 and first rigid portion 102 discussed above. The second flex portion may receive image data gathered by focal plane image sensor 114 and routed by first rigid portion 102 to first flex portion 104, and then to the second rigid portion and to the second flex portion. The second flex portion may route the image data to a signal magnification module, and/or an imaging module.

As a result of the above, the surface area of sensor surface 110 to which focal plane image sensor 114 attaches to may be maximized. As noted above, the protrusion of first flex portion 104 from the accessible surface of first rigid portion 102 may be located based on lateral distance X. Based on lateral distance X, accessible surface 112 may have less surface area than sensor surface 114. As a result, the overall space occupied by rigid flex circuit board 100 may be minimized, and multiple sensors may be spaced more closely together than if first flex portion 104 protruded from the edge.

Figure 2:
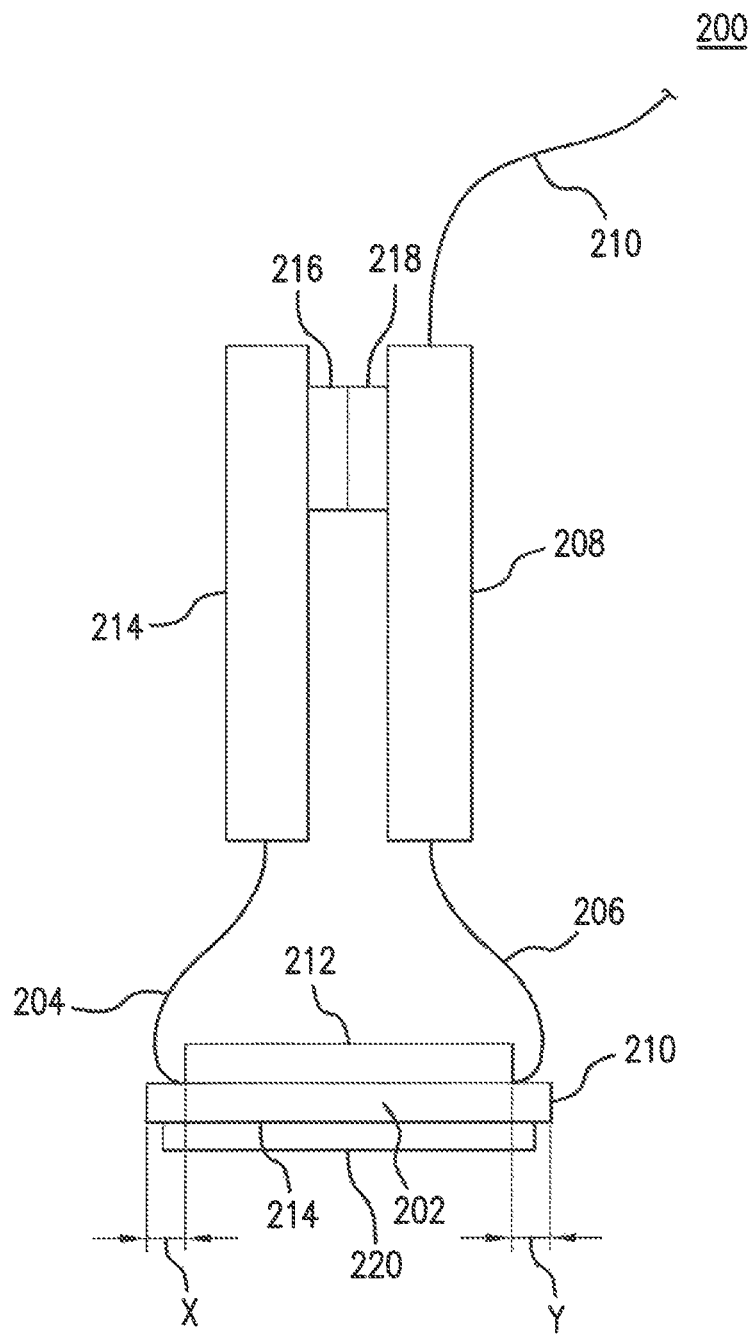
FIG. 2 depicts a cross-sectional view of an example rigid flex circuit board with a first flex that protrudes vertically from a rigid base and a second flex that protrudes vertically from the same rigid base, in which embodiments of the present disclosure, or portions thereof, may be implemented.

FIG. 2 depicts an example rigid flex circuit board 200 with a first flex that protrudes vertically from a rigid base and a second flex that protrudes vertically from the same rigid base. Rigid flex circuit board 200 includes a first rigid portion 202, a first flex portion 204, a second flex portion 206, a second rigid portion 208, a third rigid portion 214, a first connector 216, a second connector 218, a third flex portion 210, and a focal plane sensor 220. First rigid portion 202 includes accessible surface 212 and sensor surface 214.

In an embodiment, rigid flex circuit board 200 includes two flex portions connected to the rigid portion bearing the focal plane sensor rather than one. First flex portion 204 protrudes from a first edge of accessible surface 212 that is a lateral distance X from a first edge of sensor surface 210. Second flex portion 206 protrudes from a second edge of accessible surface 212 that is a lateral distance Y from a second edge of sensor surface 210. In an embodiment, first flex portion 204 and second flex portion 206 may couple to rigid portion 214 and rigid portion 208. Connector 216 may be mounted on rigid portion 214. Connector 218 may be mounted on rigid portion 208. Rigid portion 214 may be coupled to rigid portion 208 via connector 216 and connector 218. Rigid portion 208 may couple to a third flex portion 210. In another embodiment, flex portion 204 may couple to connector 218 mounted to rigid portion 208 so that rigid portion 214 may be removed. The coupling of flex portion 204 to connector 218 may provide additional space so that additional rigid flex circuit boards may be packed tightly to rigid flex circuit board 200.

Example Imaging System

Figure 3:
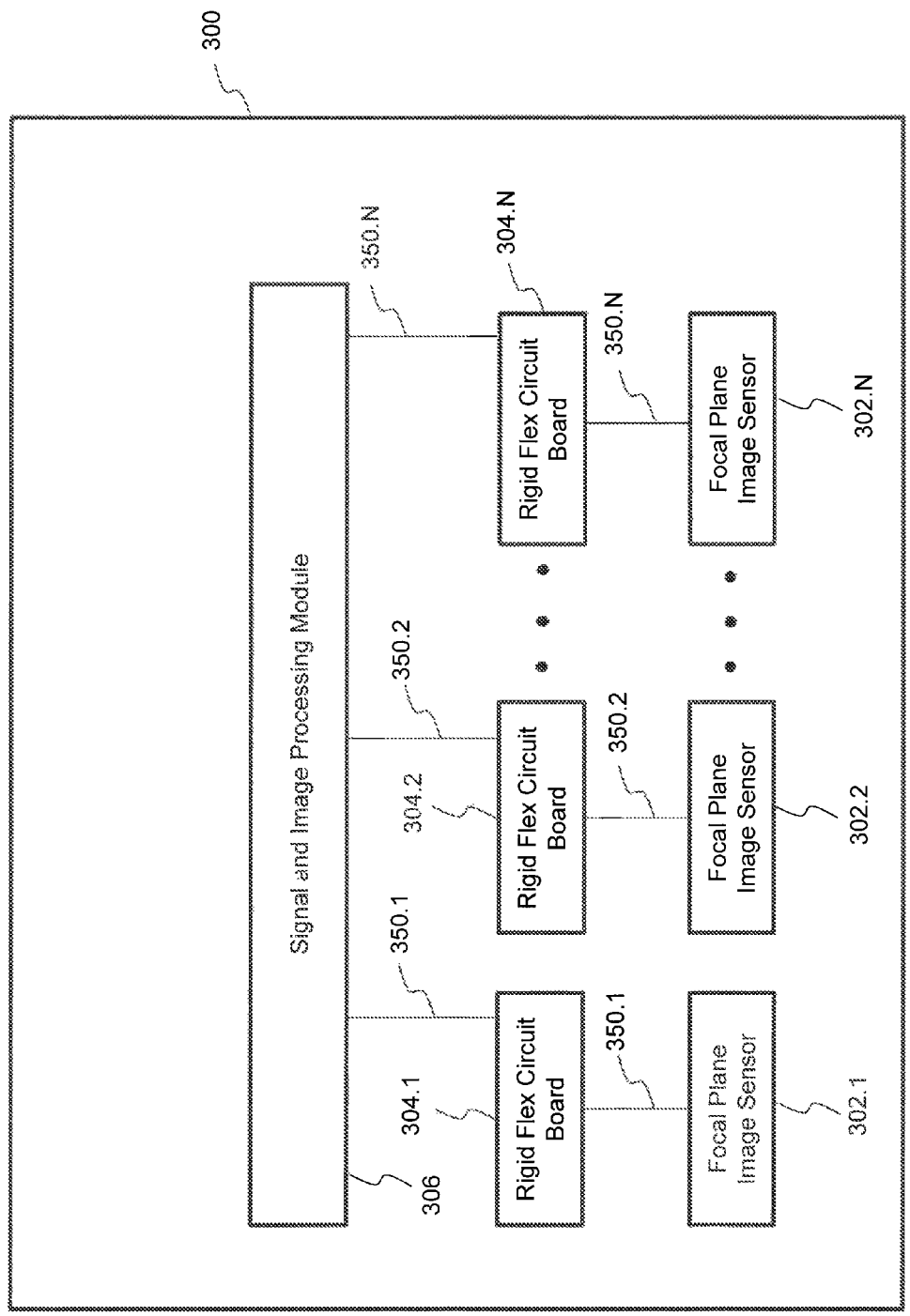
FIG. 3 depicts an example imaging system in which embodiments of the present disclosure, or portions thereof, may be implemented.

FIG. 3 depicts an example imaging system 300 in which embodiments of the present disclosure, or portions thereof, may be implemented. For example, plurality of rigid flex circuit boards 304.1 through 304.N may be implemented with rigid flex circuit board 100 to conserve space within imaging system 300. Imaging system 300 includes a plurality of focal plane image sensors 302.1 through 302.N, a plurality of rigid flex circuit boards 304.1 through 304.N, a signal and image processing module 306. Examples of imaging system 300 may include but are not limited to infrared (IR) imaging systems, digital imaging systems, medical imaging systems, thermal emission imaging systems (THEMIS), aerial imaging systems, satellite digital imaging systems (SDIS), and/or enhanced imaging systems.

Generally, embodiments described herein use each rigid flex circuit board 304.1 through 304.N, where N is an integer equal to or greater than one, to route signals coupled with imaging data. For example, each rigid flex circuit board 304.1 through 304.N may route signals coupled with data from each respective focal plane image sensor 302.1 through 302.N to signal and imaging processing module 306.

Each rigid flex circuit board 304.1 through 304.N may be coupled to a respective focal plane image sensor 302.1 through 302.N, where N is an integer equal to or greater than one. Each focal plane image sensor 302.1 through 302.N may gather image data. In an embodiment, each focal plane image sensor 302.1 through 302.N may include a device that converts an optical image into an electronic signal. In such an embodiment, each focal plane image sensor 302.1 through 302.N may include an integrated circuit containing an array of pixel sensors. Each focal plane image sensor 302.1 through 302.N converts image data 350.1 through 350.N from an analog signal to a digital signal.

Each rigid flex circuit board 304.1 through 304.N routes image data 350.1 through 350.N gathered by each focal plane image sensor 302.1 through 302.N to signal and imaging processing module 306. For example, rigid flex circuit board 304.1 routes image data 350.1 gathered by focal plane image sensor 302.1 to signal and imaging processing module 306. Rigid flex circuit board 304.2 routes image data 350.2 gathered by focal plane image sensor 302.2 to signal and imaging processing module 306. Rigid flex circuit board 304.N routes image data 350.N gathered by focal plane image sensor 302.N to signal and imaging processing module 306.

As would be appreciated by one having skill in the relevant art(s) given the description herein, imaging system 300 may include any quantity of focal plane image plane sensors 302.1 through 302.N and rigid flex circuit boards 304.1 through 304.N without departing from the spirit and scope of the present invention.

Focal Plane Image Sensor/Rigid Flex Circuit Board Configuration

Figure 4:
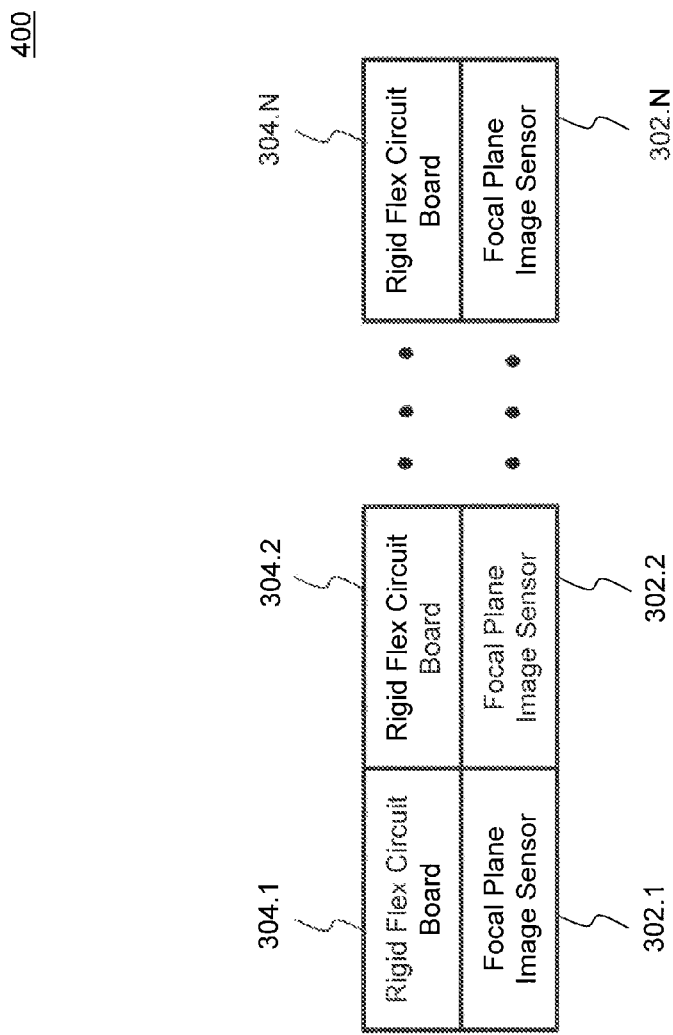
FIG. 4 depicts an example focal plane image sensor/rigid flex circuit board configuration in which embodiments of the present disclosure, or portions thereof, may be implemented.

FIG. 4 depicts an example focal plane image sensor/rigid flex circuit board configuration 400 in which embodiments of the present disclosure, or portions thereof, may be implemented. Imaging systems, such as imaging system 300, may include stringent space requirements for the necessary components of the imaging systems. Such stringent space requirements may require that focal plane image sensor/rigid flex circuit board configuration 400 be tightly packed together. The stringent space requirements may further require minimum spacing between each focal plane image sensor 302.1 through 302.N. The stringent space requirements may also require minimum spacing between each rigid flex circuit board 304.1 through 304.N. The stringent space requirements may provide a minimum surface area on each rigid flex circuit board 304.1 through 304.N to position signal and power circuits. The signal and power circuits may be required to provide power to and obtain image data from each focal plane image sensor 302.1 through 302.N. Focal plane image sensor/rigid flex circuit board configuration 400 includes focal plane image sensors 302.1 through 302.N and rigid flex circuit boards 304.1 through 304.N.

For example, each focal plane image sensor 302.1 through 302.N may be directly coupled to each respective rigid flex circuit board 304.1 through 304.N. In such an example, focal plane image sensor 302.1 may be attached to rigid flex circuit board 304.1, focal plane image sensor 302.2 may be attached to rigid flex circuit board 304.2, and focal plane image sensor 302.N may be attached to rigid flex circuit board 304.N.

Each focal plane image sensor attached to a respective rigid flex circuit board may be tightly packed next to a second focal plane image sensor attached to a second rigid flex circuit board so that minimal spacing exists between each. For example, focal plane image sensor 302.1, attached to rigid flex circuit board 304.1, may be tightly packed next to focal plane image sensor 302.2, attached to rigid flex circuit board 304.2, so that very little spacing exists between each.

In another embodiment, each focal plane image sensor 302.1 through 302.N may be very small in dimension. For example, each focal plane image sensor 302.1 through 302.N may have dimensions of 10.5 millimeters by 10.5 millimeters. The spacing between each focal plane image sensor 302.1 through 302.N may be 1 millimeter. Some spacing may exist between each rigid flex circuit board 304.1 through 304.N to allow for further thermal expansion, vibration tolerances, etc. For example, a spacing of one-half of a millimeter may exist between each.

Conventional Rigid Flex Circuit Boards

Figure 5A:
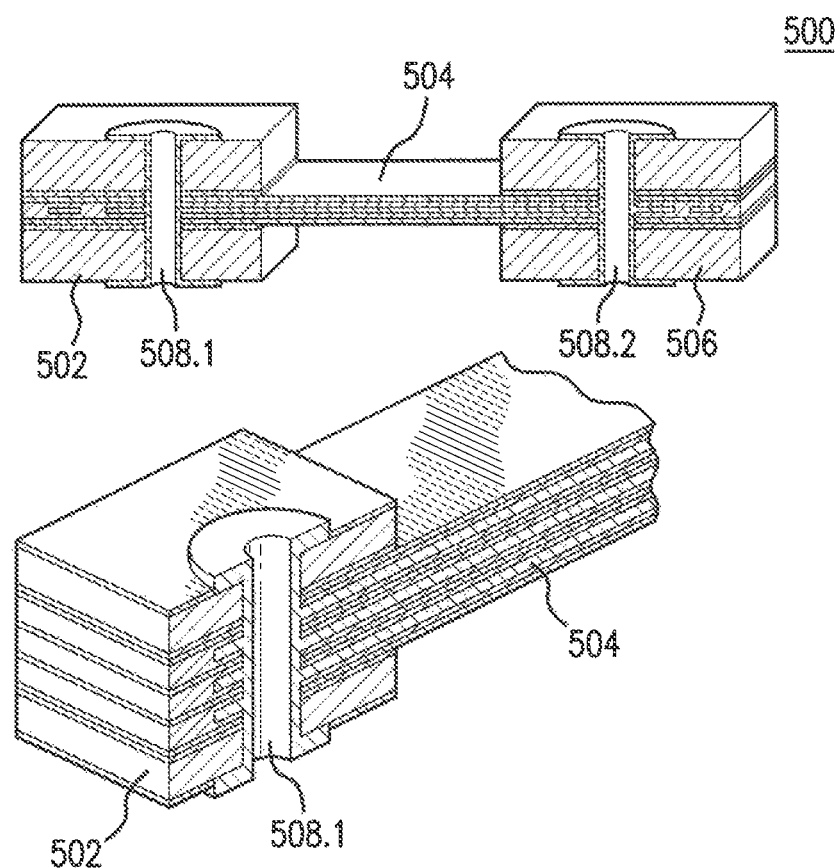
FIG. 5A depicts a cross-sectional view of a conventional rigid flex circuit board.

FIG. 5A depicts a cross-sectional view of a conventional rigid flex circuit board. Conventional rigid flex circuit board 500 includes a combination of rigid circuit boards, such as first rigid portion 502 and second rigid portion 506, and flexible circuits, such as flex portion 504. Conventional rigid flex circuit board 500 also includes vias 508.1 and 508.2. First rigid portion 502, second rigid portion 506, flex portion 504, and vias 508.1 and 508.2 form a single, electrically interconnected structure.

First rigid portion 502 and second rigid portion 506 are each produced from a multilayer circuit board. The multilayer circuit board includes two printed circuit boards (PCBs) that act as external layers, making first rigid portion 502 and second rigid portion 506 rigid. The multilayer circuit board also includes an inner flexible layer between each of the external rigid layers.

Flex portion 504 is produced from the same multilayer circuit board as both first rigid portion 502 and second rigid portion 506. Flex portion 504 is produced by removing the external rigid layers from a portion of the multilayer circuit board, leaving the inner flexible layer to make flex portion 504 a flexible structure.

Flex portion 504 is the portion of the multilayer circuit board with the external rigid layers removed so that the original electrical interconnection of the multilayer circuit board is maintained between first rigid portion 502, flex portion 504, and second rigid portion 506. In maintaining the original electrical interconnection of the multilayer circuit board, flex portion 504 protrudes from the edge of first rigid portion 502 and second rigid portion 506. The original electrical interconnection of the multilayer circuit board is maintained by vias 508.1 and 508.2 which provide electrical connection between the outer rigid layers and inner flex layers.

The protrusion of flex portion 504 from the edge of first rigid portion 502 and second rigid portion 506 hinders systems that require stringent space requirements. When flex portion 504 is bent, flex portion 504 pushes against a neighboring rigid flex circuit board. Therefore, even a bent flex portion 504 occupies some space to the edge of first rigid portion 502. Systems that require stringent space requirements may be hindered from allowing that space to be occupied by other devices, such as a second rigid flex circuit board. The protrusion of flex portion 504 from the edge of first rigid portion 502 may also hinder access to flex portion 504 in a system with stringent space requirements, where the only access to flex portion 504 is from above rigid flex circuit board 500.

Figure 5B:
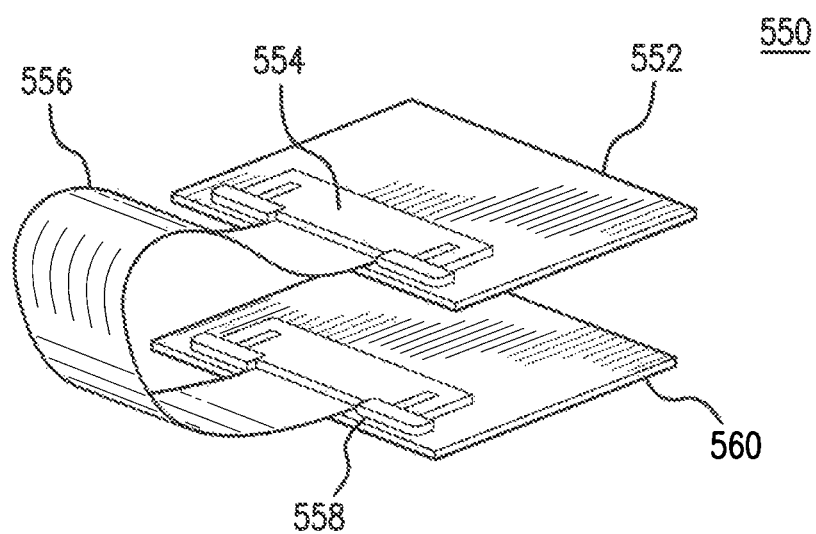
FIG. 5B depicts a conventional assembly of two rigid boards and flexible circuit circuit board where the flex portion is connected to the top surfaces of a first rigid portion and a second rigid portion via connectors.

FIG. 5B depicts a conventional assembly of two rigid boards, a flexible circuit, and two connectors, where the flex portion is connected to the surfaces of a first rigid portion and a second rigid portion via connectors. Conventional rigid board flexible circuit assembly 550 includes a first rigid portion 552, a first connector 554, a flex portion 556, a second connector 558, and a second rigid portion 560.

Rather than having the flex portion protrude from the edge of the rigid portion, conventional rigid board flexible circuit assembly 550 includes flex portion 556 protruding from the top surface of each of first rigid portion 552 and second rigid portion 560, rather than the edge of each. Flex portion 556 connects vertically to the top surface of first rigid portion 552 via first connector 554. Flex portion 556 connects to second rigid portion 560 via second connector 558.

The protrusion of flex portion 556 from the top surface of first rigid portion 552 and second rigid portion 560 occupies less planar surface area than if flex portion 556 protruded from the edge of first rigid portion 552. The protrusion of flex portion 556 from the top surface also provides easier access to flex portion 556 in a tight space than if flex portion 556 protruded from the edge of first rigid portion 552.

Rigid Flex Circuit Board Configuration

Figure 6:
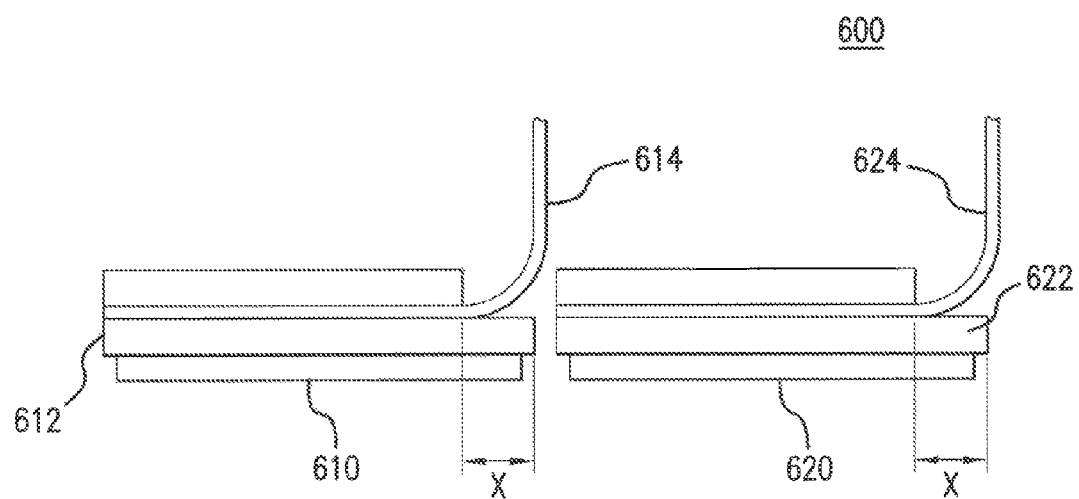
FIG. 6 depicts a cross-sectional view of an example rigid flex circuit board in which embodiments of the present disclosure, or portions thereof, may be implemented.

FIG. 6 depicts an example rigid flex circuit board configuration 600 in which embodiments of the present disclosure, or portions thereof, may be implemented. Rigid flex circuit board configuration 600 includes a first rigid flex circuit board 612 and a second rigid flex circuit board 624. First rigid flex circuit board 612 includes a first rigid portion 602, and a first flex portion 604. Second rigid flex circuit board 624 includes a first rigid portion 614, and a first flex portion 616.

As noted above, rigid flex circuit board configuration 600 may have stringent space requirements. Such stringent space requirements may require that each rigid flex circuit board included in rigid flex circuit board configuration 600, along with its attached image sensor, be tightly packed together. In an embodiment, first rigid flex circuit board 610 may fit together with second rigid flex circuit board 620 forming rigid flex circuit board configuration 600.

For example, first rigid flex circuit board 610 may be placed next to second rigid flex circuit board 620. The lateral distance X may enable first flex portion 614 to protrude upward from first rigid flex circuit board 610 rather than from an edge of first rigid flex circuit board 610. The lateral distance X may enable second rigid flex circuit board 620 to be placed closer to first rigid flex circuit board 610 than when the lateral distance X is equal to zero, forcing first flex portion 614 to protrude from the edge of first rigid flex circuit board 610. The space occupied by first flex portion 614 when the lateral distance X is zero may prohibit second rigid flex circuit board 620 from being placed as close to first rigid flex circuit board 610 compared to when first flex portion 614 protrudes upward. As would be appreciated by one having skill in the relevant art(s) given the description herein, rigid flex circuit board configuration 600 may include any quantity of rigid flex circuit boards without departing from the spirit and scope of the present invention.

Figure 7:
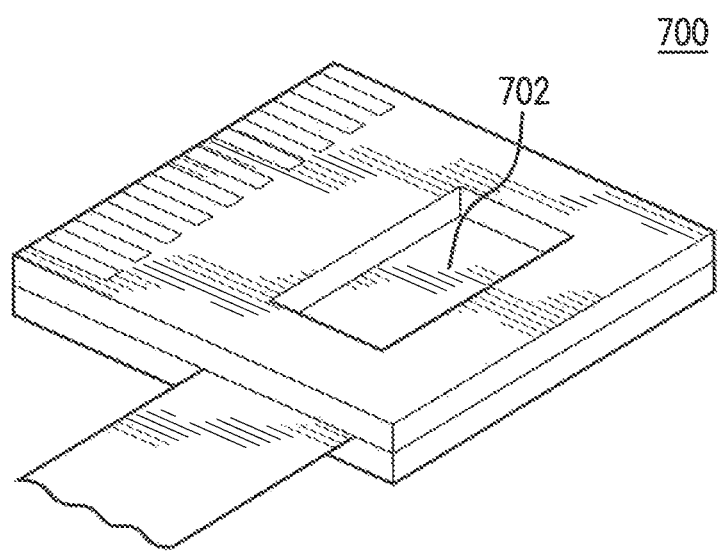
FIG. 7 depicts an example rigid flex circuit board that provides a grip area on the rigid flex circuit board, in which embodiments of the present disclosure, or portions thereof, may be implemented.

FIG. 7 depicts an example rigid flex circuit board 700 that provides a grip area 702 on rigid flex circuit board 700. Grip area 702 may enable rigid flex circuit board 700 to be gripped and removed from a rigid flex circuit board configuration, such as rigid flex circuit board configuration 600, without disturbing another rigid flex circuit board that may be tightly packed adjacent to rigid flex circuit board 700. For example, rigid flex circuit board 700 may be adjacent to a second rigid flex circuit board. Grip area 702 may enable the first rigid flex circuit board to be removed without disturbing the second rigid flex circuit board.

Figure 8:
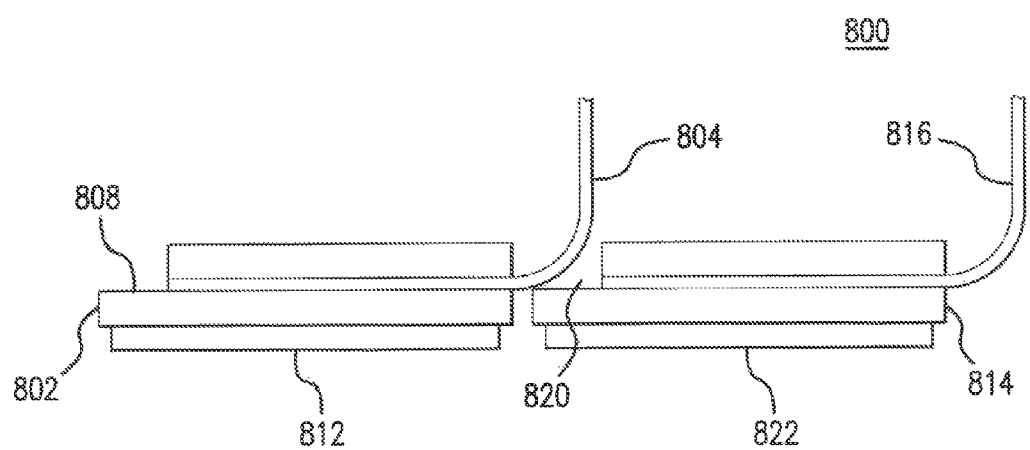
FIG. 8 depicts an example rigid flex circuit board assembly, in which embodiments of the present disclosure, or portions thereof, may be implemented.

FIG. 8 depicts an example rigid flex circuit board assembly 800, according to an embodiment. Rather than the first flex portion protruding from the accessible surface of the first rigid portion, the first flex portion protrudes from the edge of the first rigid portion and passes through a slot in the second rigid flex circuit board. First rigid flex circuit board 812 includes a first rigid portion 802, a first flex portion 804, and a notch 808. Second rigid flex circuit board 822 includes a first rigid portion 814, a second flex portion 816 and a notch 820.

In an embodiment, first flex portion 804 protrudes from the edge of first rigid portion 802 rather than from the accessible surface of first rigid portion 802. First flex portion 804 routes through notch 820 located in first rigid portion 814 of second rigid flex circuit board 822. First flex portion 804 protrudes from the accessible surface of first rigid portion 814 of second rigid flex circuit board 822.

First flex portion 816 of second rigid flex circuit board 822 protrudes from the edge of first rigid portion 814 of second rigid flex circuit board 822. First flex portion 816 may route through a notch located in a first rigid portion of a third rigid flex circuit board (not shown) in a similar manner as described above. First flex portion 816 may protrude from the accessible surface of the third rigid flex circuit board. As would be appreciated by one having skill in the relevant art(s) given the description herein, rigid flex circuit board assembly 800 may include any quantity of rigid flex circuit boards without departing from the spirit and scope of the present invention. In an embodiment, the parallel fashion of first flex portion 804 and first flex portion 816 may enable each flex portion to be accessible from the top of rigid flex circuit board assembly 800. In such an embodiment, the end of first flex portion 804 and first flex portion 816 nearest to the rigid flex circuit board is the proximal end and the end of first flex portion 804 and first flex portion 816 extending away from the circuit board is distal end.

CONCLUSION

The Brief Summary and Abstract sections may set forth one or more but not all example embodiments and thus are not intended to limit the scope of the present disclosure and the appended claims in any way.

Embodiments have been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

The foregoing description of specific embodiments will so fully reveal the general nature of the disclosure that others may, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described example embodiments, but should be defined only in accordance with the following claims and their equivalents.

What is claimed is:

1. A rigid flex circuit board, comprising:
    a first rigid substrate;
    a second rigid substrate that includes a non-overlap region, wherein the first rigid substrate is not extended over the non-overlap region of the second rigid substrate;
    a first portion of a flexible substrate between the first rigid substrate and the second rigid substrate, wherein the first rigid substrate, the second rigid substrate and the first portion of the flexible substrate are bonded together; and
    a second portion of the flexible substrate that protrudes from the non-overlap region, wherein the second portion of the flexible substrate is not adhered to the second rigid substrate in the non-overlap region.

2. The rigid flex circuit board of claim 1, wherein the second portion of the flexible substrate is configured to be accessible from the non-overlap region of the rigid flex circuit board.

3. The rigid flex circuit board of claim 1, wherein no portion of the first portion of the flexible substrate is present in a portion of the non-overlap region.

4. The rigid flex circuit board of claim 1, wherein the second portion of the flexible substrate is configured to protrude from the non-overlap region perpendicular to the second rigid substrate.

5. The rigid flex circuit board of claim 4, wherein the non-overlap region is configured to avoid mechanical interference with a second rigid flex circuit board.

6. The rigid flex circuit board of claim 5, wherein the second portion of the flexible substrate is further configured to protrude from the non-overlap region in a manner to avoid mechanical interference with the second rigid flex circuit board.

7. The rigid flex circuit board of claim 1, wherein the non-overlap region is further configured to provide accessibility to the rigid flex circuit board to remove the rigid flex circuit board from a rigid flex circuit board configuration.

8. The rigid flex circuit board of claim 1, further comprising:
    a first rigid portion that includes the first rigid substrate, the second rigid substrate and the first portion of the flexible substrate; and a second rigid portion electrically coupled to the first rigid portion via the second portion of the flexible substrate.

9. The rigid flex circuit board of claim 8, wherein the rigid flex circuit board is physically coupled to a second rigid flex circuit board.

10. The rigid flex circuit board of claim 9, wherein the first rigid portion of the rigid flex circuit board and a first rigid portion of the second rigid flex circuit board are adjacent when the rigid flex circuit board is physically coupled to the second rigid flex circuit board.

11. The rigid flex circuit board of claim 9, wherein a distal portion of the flexible substrate of the rigid flex circuit board is parallel to a distal portion of flexible substrate of the second rigid flex circuit board when the rigid flex circuit board is physically coupled to the second rigid flex circuit board.

12. The rigid flex circuit board of claim 8, wherein the second rigid substrate of the first rigid portion is electrically coupled to a focal plane imaging sensor.

13. The rigid flex circuit board of claim 8, further comprising a third portion of the flexible substrate, wherein the third portion of the flexible substrate is electrically coupled to a signal and imaging processing module.

14. The rigid flex circuit board of claim 13, wherein the rigid flex circuit board is further configured to route information from the focal plane imaging sensor to the signal and imaging processing module.

15. The rigid flex circuit board of claim 8, wherein the first rigid portion comprises a sensor surface and an accessible surface, and wherein the sensor surface of the first rigid portion has a first surface area and a first shape and the accessible surface of the first rigid portion has a second surface area and a second shape, wherein the first surface area is different from the second surface area and the first shape is different from the second shape.

16. The rigid flex circuit board of claim 8, wherein the first rigid portion and the second rigid portion of the flexible substrate are produced from a single multilayer circuit board.

17. The rigid flex circuit board of claim 1, wherein the first rigid substrate, the second rigid substrate, and the first portion of the flexible substrate are bonded together in a rigid printed circuit board (PCB).

18. A rigid flex circuit board assembly, comprising:
a printed circuit board (PCB) having:
a first rigid substrate;
a second rigid substrate that includes an asymmetrical region, wherein the first rigid substrate is not extended over the asymmetrical region of the second rigid substrate;
a first portion of the first flexible substrate is sandwiched between the first rigid substrate and the second rigid substrate,
wherein the first rigid substrate, the second rigid substrate and the first portion of the first flexible substrate are coupled together into a sandwich configuration with the asymmetrical region excluded from the sandwich configuration; and
a second portion of the flexible substrate that protrudes from the asymmetrical region, wherein the second portion of the flexible substrate is excluded from the sandwich configuration and is not adhered to the second rigid substrate in the asymmetrical region.

19. The rigid flex circuit board of claim 18, wherein the second portion of the flexible substrate is configured to be accessible from the asymmetrical region of the rigid flex circuit board.

20. The rigid flex circuit board of claim 18, wherein no portion of the first portion of the flexible substrate is present in a portion of the asymmetrical region.

21. The rigid flex circuit board of claim 18, wherein the second portion of the flexible substrate is electrically coupled to the sandwich configuration.

22. The rigid flex circuit board of claim 18, wherein the second portion of the flexible substrate is joined to the first portion of the flexible substrate.

23. A rigid flex circuit board assembly, comprising:
a first rigid flex circuit board, wherein the first rigid flex circuit board includes at least a first rigid portion and a first flex portion; and
a second rigid flex circuit board that includes at least a first rigid portion and a first flex portion,
wherein the first flex portion of the second rigid flex circuit board is routed through a notch cut in the first rigid flex circuit board.

24. The rigid flex circuit board assembly of claim 23, wherein the first flex portion of the second rigid flex circuit board is further configured to protrude from the second rigid flex circuit board perpendicular from the second rigid flex circuit board through the notch cut in the first rigid flex circuit board.

25. The rigid flex circuit board assembly of claim 23, wherein the first flex portion of the first rigid flex circuit board is routed through a notch cut in a third rigid flex circuit board.

26. The rigid flex circuit board assembly of claim 25, wherein a distal portion of the first flex portion of the second rigid flex circuit board is parallel to the distal portion of the first flex portion of the first rigid flex circuit board when the first flex portion of the second rigid flex circuit board is routed through the notch of the first rigid flex circuit board and the first flex portion of the first rigid flex circuit board is routed through the notch of the third rigid flex circuit board.

27. The rigid flex circuit board assembly of claim 23, wherein the first flex portion of the first rigid flex circuit board and the first flex portion of the second rigid flex circuit board are further configured to be accessible from an accessible surface of the rigid flex circuit board assembly.

* * * * *